(12) United States Patent
Kim et al.

(10) Patent No.: US 8,421,528 B2
(45) Date of Patent: Apr. 16, 2013

(54) SEMICONDUCTOR INTEGRATED CIRCUIT

(75) Inventors: Hyun Seok Kim, Icheon-si (KR); Jun Ho Lee, Seongnam-si (KR); Boo Ho Jung, Icheon-si (KR); Sun Ki Cho, Icheon-si (KR); Yang Hee Kim, Icheon-si (KR); Young Won Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 168 days.

(21) Appl. No.: 13/097,326

(22) Filed: Apr. 29, 2011

(65) Prior Publication Data

US 2012/0049943 A1 Mar. 1, 2012

(30) Foreign Application Priority Data

Aug. 27, 2010 (KR) ........................ 10-2010-0083614

(51) Int. Cl.
*G05F 1/10* (2006.01)
(52) U.S. Cl.
USPC .......................................... 327/546

(58) Field of Classification Search ..................... 326/80, 326/81; 327/545, 546, 551, 558, 559, 564, 327/565
See application file for complete search history.

(56) References Cited

U.S. PATENT DOCUMENTS

| | | | |
|---|---|---|---|
| 5,374,887 A * | 12/1994 | Drobnik | 323/299 |
| 6,335,654 B1 * | 1/2002 | Cole | 327/546 |
| 8,120,416 B2 * | 2/2012 | Kim et al. | 327/551 |

FOREIGN PATENT DOCUMENTS

| | | |
|---|---|---|
| KR | 1020030081081 A | 10/2003 |
| KR | 1020050120174 A | 12/2005 |
| KR | 1020090045499 A | 5/2009 |

* cited by examiner

*Primary Examiner* — Jeffrey Zweizig
(74) *Attorney, Agent, or Firm* — William Park & Associates Ltd.

(57) ABSTRACT

A semiconductor integrated circuit includes a first voltage line to which a first ground voltage is applied, a second voltage line to which a second ground voltage is applied, a third voltage line to which a first power supply voltage is applied, and a coupling unit including a MOS transistor having a source coupled to the first voltage line, a drain coupled to the second voltage line, and a gate coupled to the third voltage line.

7 Claims, 3 Drawing Sheets

SEMICONDUCTOR INTEGRATED CIRCUIT

CROSS-REFERENCES TO RELATED APPLICATIONS

The present application claims priority under 35 U.S.C 119(a) to Korean Application No. 10-2010-0083614, filed on Aug. 27, 2010, in the Korean intellectual property Office, which is incorporated herein by reference in its entirety set forth in full.

BACKGROUND

Embodiments of the present invention relate to a semiconductor integrated circuit.

A semiconductor integrated circuit is supplied with a first power supply voltage VDD, a second power supply voltage VDDQ, a first ground voltage VSS, and a second ground voltage VSSQ through separate pins in order to ensure operational stability and provide various functions. The first power supply voltage VDD and the first ground voltage VSS are supplied to an internal control circuit of the semiconductor integrated circuit, and the power supply voltage VDDQ and the second ground voltage VSSQ are supplied for data transmission of the semiconductor integrated circuit.

The first ground voltage VSS and the second ground voltage VSSQ applied through the separate pins are transferred through voltage lines. Here, the voltage lines contain inductance components. Since inductance components generate a counter electromotive force having an opposite polarity to an external voltage, the voltage lines containing the inductance components mutually share high frequency power noises. As the inductance components of the voltage lines increase, the mutual sharing of the high frequency power noises between the voltage lines increases. Therefore, much research is being conducted to develop technologies which can substantially reduce the mutual sharing of power noises by shorting the voltage lines through which the first ground voltage VSS and the second ground voltage VSSQ are transferred in a high frequency range.

One of examples which short the voltage lines in the high frequency range is to couple the voltage lines, through which the first ground voltage VSS and the second ground voltage VSSQ are transferred, by metal lines. In the high frequency range, the metal lines substantially reduce inductance components of voltage lines through which the first ground voltage VSS and the second ground voltage VSSQ are transferred, thereby reducing the mutual sharing of power noises. However, if the power lines are connected by the metal lines, the short-circuited state of the voltage lines is maintained in all the frequency ranges, the voltage lines through which the first ground voltage VSS and the second ground voltage VSSQ are transferred also mutually share power noises in a low frequency range. In addition, when metal lines occupying a large area are used to short the voltage lines, the layout area of the semiconductor integrated circuit may increase.

Meanwhile, the voltage lines through which the second power supply voltage VDDQ and the first ground voltage VSS are transferred, and the voltage lines through which the first power supply voltage VDD and the second ground voltage VSSQ are transferred, may be shorted using capacitors. When the capacitors shorting the voltage lines are implemented with MOS transistors, the occupied area thereof may become small and the capacitors may operate in only the high frequency range, whereby power noises shared by the voltage lines may decrease. However, current cannot be supplied through the capacitors shorting the voltage lines in the high frequency range, because a closed circuit allowing a current to flow is not formed between the voltage lines through which the second power supply voltage VDDQ and the first ground voltage VSS are transferred, or between the voltage lines through which the first power supply voltage VDD and the second ground voltage VSSQ are transferred.

SUMMARY

An embodiment of the present invention is directed to provide a semiconductor integrated circuit which can substantially reduce the sharing of high frequency power noises and supply a current in a high frequency range.

In an embodiment of the present invention, a semiconductor integrated circuit includes a first voltage line to which a first ground voltage is applied, a second voltage line to which a second ground voltage is applied, a third voltage line to which a first power supply voltage is applied, and a coupling unit including a MOS transistor having a source coupled to the first voltage line, a drain coupled to the second voltage line, and a gate coupled to the third voltage line.

In another embodiment of the present invention, a semiconductor integrated circuit includes a coupling unit configured to reduce high frequency power noises, wherein the coupling unit includes a well region formed between isolation films on a semiconductor substrate, a source region and a drain region formed in the well region, a gate oxide film formed on a channel region formed between the source region and the drain region, a gate electrode formed on the gate oxide film, a first contact coupling the source region to a first voltage line to which a first ground voltage is applied, a second contact coupling the drain region to a second voltage line to which a second ground voltage is applied, and a third contact coupling the gate electrode to a third voltage line to which a first power supply voltage is applied.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
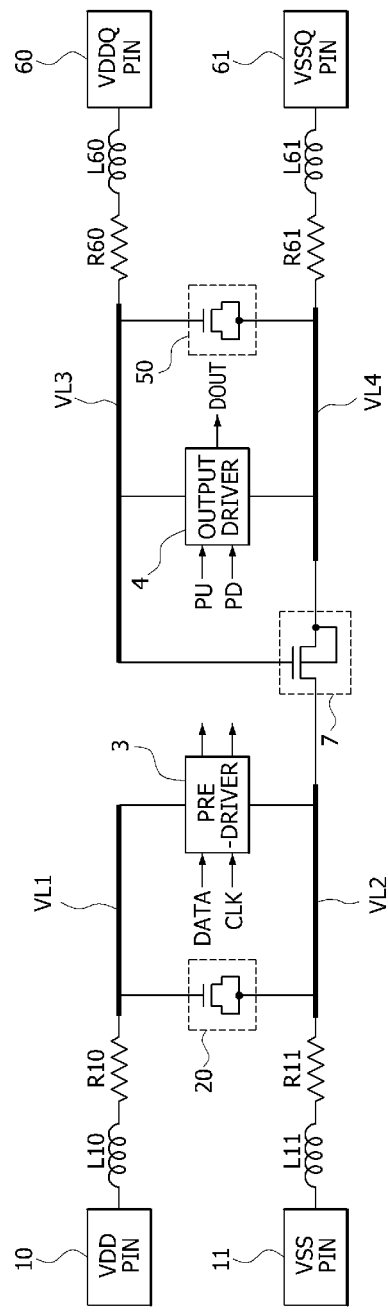
FIG. 1 is a configuration diagram of a semiconductor integrated circuit according to an embodiment of the present invention.

FIG. 1 is a configuration diagram of a semiconductor integrated circuit according to an embodiment of the present invention.

As illustrated in FIG. 1, the semiconductor integrated circuit according to the embodiment of the present invention includes first to fourth voltage lines VL1 to VL4, a first voltage stabilization unit 20, a pre-driver 3, an output driver 4, a second voltage stabilization unit 50, and a coupling unit 7.

A first power supply voltage VDD is inputted through a VDD pin 10 and applied to the first voltage line VL1 through a first inductor L10 and a first resistor R10. A first ground voltage VSS is inputted through a VSS pin 11 and applied to the second voltage line VL2 through a second inductor L11 and a second resistor R11. A second power supply voltage VDDQ is inputted through a VDDQ pin 60 and applied to the third voltage line VL3 through a third inductor L160 and a third resistor R60. A second ground voltage VSSQ is inputted through a VSSQ pin 61 and applied to the fourth voltage line VL4 through a fourth inductor L61 and a fourth resistor R61. The first inductor L10 and the first resistor R10 are elements which are implemented by modeling an inductance component and a resistance component between the VDD pin 10 and the first voltage line VL1. The second inductor L11 and the second resistor R11 are elements which are implemented by modeling an inductance component and a resistance component between the VSS pin 11 and the second voltage line VL2. The third inductor L60 and the third resistor R60 are elements which are implemented by modeling an inductance component and a resistance component between the VDDQ pin 60 and the third voltage line VL3. In addition, the fourth inductor L61 and the fourth resistor R61 are elements which are implemented by modeling an inductance component and a resistance component between the VSSQ pin 61 and the fourth voltage line VL4.

The first voltage stabilization unit 20 is implemented with an NMOS transistor 20 having a gate coupled to the first voltage line VL1, and a source and a drain coupled to the second voltage line VL2. The first voltage stabilization unit 20 operates as a capacitor to stabilize the levels of the first power supply voltage VDD and the first ground voltage VSS supplied through the first voltage line VL1 and the second voltage line VL2.

The pre-driver 3 is driven by the first power supply voltage VDD and the first ground voltage VSS which are supplied through the first voltage line VL1 and the second voltage VL2, respectively. The pre-driver 3 receives data DATA in synchronization with a clock signal CLK and drives a pull-up signal PU and a pull-down signal PD.

The output driver 4 is driven by the second power supply voltage VDDQ and the second ground voltage VSSQ which are supplied through the third voltage line VL3 and the fourth voltage VL4, respectively. The output driver 4 receives the pull-up signal PU and the pull-down signal PD and drives output data DOUT.

The second voltage stabilization unit 50 is implemented with an NMOS transistor 50 having a gate coupled to the third voltage line VL3, and a source and a drain coupled to the fourth voltage line VL4. The first voltage stabilization unit 50 operates as a capacitor to stabilize the levels of the second power supply voltage VDDQ and the second ground voltage VSSQ supplied through the third voltage line VL3 and the fourth voltage line VL4.

The coupling unit 7 is implemented with a MOS transistor having a gate coupled to the third voltage line VL3, a source (or a drain) coupled to the second voltage line VL2, and the drain (or the source) coupled to the fourth voltage line VL4. A detailed configuration of the coupling unit 7 will be described below with reference to a cross-sectional view of FIG. 2.

Figure 2:
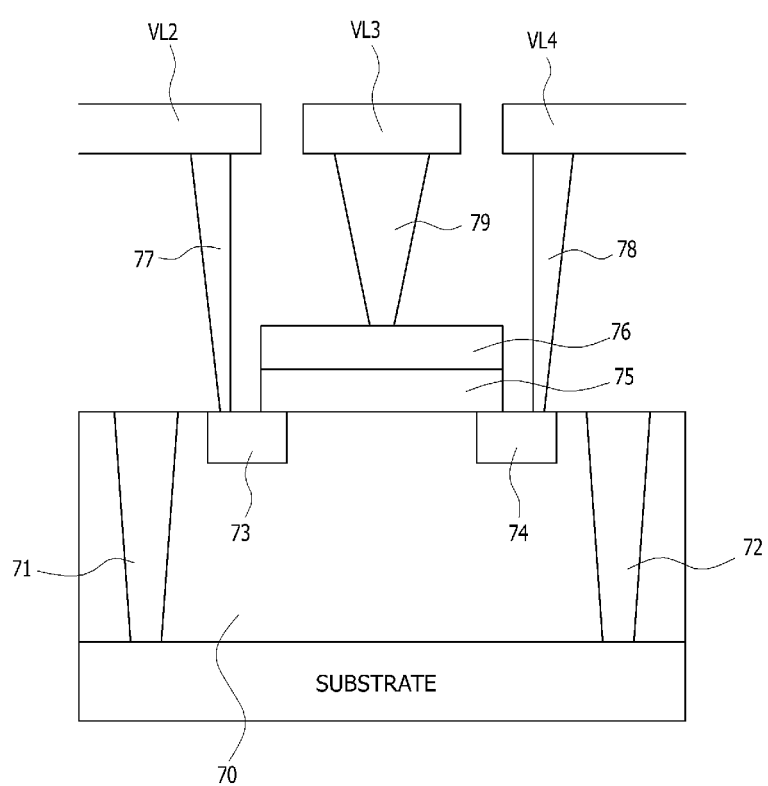
FIG. 2 is a cross-sectional view of a coupling unit included in the semiconductor integrated circuit illustrated in FIG. 1.
Figure 3:
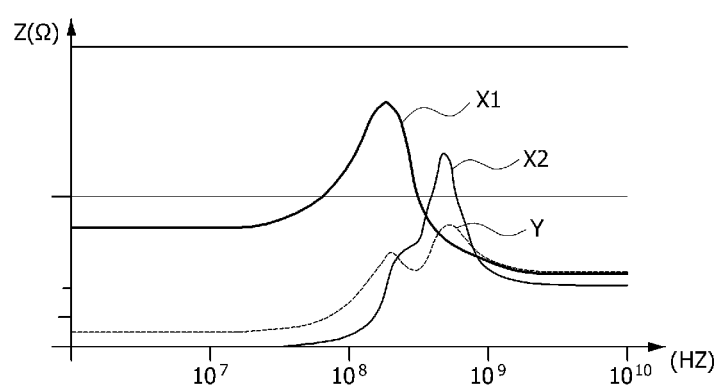
FIG. 3 is a waveform diagram illustrating the reduction in the sharing of high frequency power noises in the semiconductor integrated circuit illustrated in FIG. 1.

Referring to FIG. 2, the coupling unit 7 includes a P-well region 70 formed between isolation films 71 and 72 on a semiconductor substrate, a source region 73, a drain region 74, a gate oxide film 75, a gate electrode 76, and first to third contacts 77 to 79. The source region 73 and the drain region 74 are formed by implanting electron ions into the P-well region 70 by an ion implantation process. The gate oxide film 75 is formed on the P-well region, the source region 73, and the drain region 74. The gate electrode 76 is formed on the gate oxide film 75. The source region 73 is coupled through the first contact 77 to the second voltage line VL2, and the first ground voltage VSS is applied to the source region 73. The drain region 74 is coupled through the second contact 78 to the fourth voltage line VL4, and the second ground voltage VSSQ is applied to the drain region 74. The gate electrode 76 is coupled through the third contact 79 to the third voltage line VL3, and the second power supply voltage VDDQ is applied to the gate electrode 76.

Referring to FIGS. 1 and 2, the first ground voltage VSS inputted through the VSS pin 11 is applied to the coupling unit 7 of the coupling unit 7 through the second voltage line VL2. The second ground voltage VSSQ inputted through the VSSQ pin 61 is applied to the drain region 74 of the coupling unit 7 through the fourth voltage line VL4. The second power supply voltage VDDQ inputted through the VDDQ pin 60 is applied to the gate electrode 76 of the coupling unit 7 through the third voltage line VL3. That is, the coupling unit 7 operates as the capacitor which receives the first ground voltage VSS and the second ground voltage VSSQ having the same level through the source region 73 and the drain region 74. Therefore, the coupling unit 7 is shorted in the high frequency range to thereby substantially reduce the mutual sharing of power noises between the second voltage line VL2 to which the first ground voltage VSS is applied and the fourth voltage line VL4 to which the second ground voltage VSSQ is applied. Moreover, in the high frequency range, the coupling unit 7 can make a current flow by forming a current path between the gate electrode 76 to which the second power supply voltage VDDQ is applied and the drain region 74 to which the second ground voltage VSSQ is applied.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor integrated circuit comprising:
   a first voltage line to which a first ground voltage is applied;
   a second voltage line to which a second ground voltage is applied;
   a third voltage line to which a first power supply voltage is applied; and
   a coupling unit including a MOS transistor having a source coupled to the first voltage line, a drain coupled to the second voltage line, and a gate coupled to the third voltage line.

2. The semiconductor integrated circuit of claim 1, further comprising:
   a fourth voltage line to which a second power supply voltage is applied; and
   a pre-driver configured to be driven by the second power supply voltage and the second ground voltage, receive data in synchronization with a clock signal, and drive a pull-up signal and a pull-down signal.

3. The semiconductor integrated circuit of claim 2, further comprising an output driver configured to be driven by the first power supply voltage and the first ground voltage, receive the pull-up signal and the pull-down signal, and drive output data.

4. The semiconductor integrated circuit of claim 2, further comprising:
   a first voltage stabilization unit coupled between the first power supply voltage and the first ground voltage; and a second voltage stabilization unit coupled between the second power supply voltage and the second ground voltage.

5. A semiconductor integrated circuit comprising:
a coupling unit configured to reduce high frequency power noises, wherein the coupling unit includes:
a well region formed between isolation films on a semiconductor substrate;
a source region and a drain region formed in the well region;
a gate oxide film formed on a channel region formed between the source region and the drain region;
a gate electrode formed on the gate oxide film;
a first contact coupling the source region to a first voltage line to which a first ground voltage is applied;
a second contact coupling the drain region to a second voltage line to which a second ground voltage is applied; and
a third contact coupling the gate electrode to a third voltage line to which a first power supply voltage is applied.

6. The semiconductor integrated circuit of claim 5, wherein the second ground voltage is supplied to a pre-driver which receives data in synchronization with a clock signal and drives a pull-up signal and a pull-down signal.

7. The semiconductor integrated circuit of claim 6, wherein the first power supply voltage and the first ground voltage are supplied to an output driver which receives the pull-up signal and the pull-down signal and drives output data.

* * * * *